United States Patent
Nakakita et al.

(10) Patent No.: US 7,319,420 B2
(45) Date of Patent: Jan. 15, 2008

(54) CASCADE-TYPE VARIABLE-ORDER DELTA-SIGMA MODULATOR

(75) Inventors: Masato Nakakita, Takatsuki (JP); Fumihito Inukai, Kyoto (JP); Hitoshi Kobayashi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/338,651

(22) Filed: Jan. 25, 2006

(65) Prior Publication Data

US 2006/0164274 A1 Jul. 27, 2006

(30) Foreign Application Priority Data

Jan. 25, 2005 (JP) ............................. 2005-017282

(51) Int. Cl.
*H03M 3/00* (2006.01)
(52) U.S. Cl. .......................................... 341/143; 341/76
(58) Field of Classification Search ................. 341/143
See application file for complete search history.

(56) References Cited

U.S. PATENT DOCUMENTS

| | | | | |
|---|---|---|---|---|
| 4,704,600 A | * | 11/1987 | Uchimura et al. | 341/143 |
| 5,274,374 A | * | 12/1993 | Powell et al. | 341/143 |
| 5,627,536 A | * | 5/1997 | Ramirez | 341/141 |
| 6,362,762 B1 | * | 3/2002 | Jensen et al. | 341/143 |
| 6,407,689 B1 | * | 6/2002 | Bazarjani et al. | 341/143 |
| 6,538,592 B1 | * | 3/2003 | Yang et al. | 341/143 |
| 6,839,012 B2 | * | 1/2005 | Kawamura | 341/143 |

FOREIGN PATENT DOCUMENTS

JP 2004-80152 3/2004

* cited by examiner

*Primary Examiner*—Howard L. Williams
(74) *Attorney, Agent, or Firm*—Wenderoth, Lind & Ponack, L.L.P.

(57) ABSTRACT

A cascade-type variable-order delta-sigma modulator with low power consumption that can change the number of stages of the quantization loops, which are connected in a cascade configuration, to an optimum number depending on peripheral circuitries in a configuration as simple as possible. The present invention includes first to $n^{th}$ stages of delta-sigma modulating type quantization loops (n is an integer equal to or more than 2) connected in a cascade configuration, and a noise rejecting circuit. Each quantization loop quantizes an input signal, outputs the quantization result, and feeds back the quantization result to itself. The noise rejecting circuit rejects a quantization noise of the first stage of quantization loop, and comprises (n−1) selectors for activating and de-activating the respective output signals of the second and succeeding stages of the quantization loops in compliance with the control signal.

18 Claims, 10 Drawing Sheets

*Fig. 5A*

| CONTROL SIGNAL CS | SELECTOR 3 | SELECTOR 18$_1$ | SELECTOR 18$_2$ | ... | SELECTOR 18$_{n-1}$ |
|---|---|---|---|---|---|
| HIGH | SELECTS INPUT CIRCUIT 1 | SELECTS OUTPUT SIGNAL OF DIFFERENTIATOR | SELECTS OUTPUT SIGNAL OF DIFFERENTIATOR | ... | SELECTS OUTPUT SIGNAL OF DIFFERENTIATOR |
| LOW | SELECTS INPUT CIRCUIT 2 | SELECTS OUTPUT SIGNAL OF ZERO-SIGNAL GENERATOR | SELECTS OUTPUT SIGNAL OF ZERO-SIGNAL GENERATOR | ... | SELECTS OUTPUT SIGNAL OF ZERO-SIGNAL GENERATOR |

*Fig. 5B*

| CONTROL SIGNAL CS | SELECTOR 3 | SELECTOR 18$_1$ | SELECTOR 18$_2$ | ... | SELECTOR 18$_{n-1}$ |
|---|---|---|---|---|---|
| 11···11 | SELECTS INPUT CIRCUIT 1 | SELECTS OUTPUT SIGNAL OF DIFFERENTIATOR | SELECTS OUTPUT SIGNAL OF DIFFERENTIATOR | ... | SELECTS OUTPUT SIGNAL OF DIFFERENTIATOR |
| 11···10 | SELECTS INPUT CIRCUIT 2 | SELECTS OUTPUT SIGNAL OF ZERO-SIGNAL GENERATOR | SELECTS OUTPUT SIGNAL OF DIFFERENTIATOR | ... | SELECTS OUTPUT SIGNAL OF DIFFERENTIATOR |
| ·· | ·· | ·· | ·· | ·· | ·· |
| 00···00 | SELECTS INPUT CIRCUIT m | SELECTS OUTPUT SIGNAL OF ZERO-SIGNAL GENERATOR | SELECTS OUTPUT SIGNAL OF ZERO-SIGNAL GENERATOR | ... | SELECTS OUTPUT SIGNAL OF ZERO-SIGNAL GENERATOR |

*Fig.8A*

| CONTROL SIGNAL CS | SELECTOR 3A | SELECTOR 18₁ | SELECTOR 18₂ | ... | SELECTOR 18ₙ₋₁ |
|---|---|---|---|---|---|
| HIGH | SELECTS INPUT CIRCUIT 7A | SELECTS OUTPUT SIGNAL OF DIFFERENTIATOR | SELECTS OUTPUT SIGNAL OF DIFFERENTIATOR | ... | SELECTS OUTPUT SIGNAL OF DIFFERENTIATOR |
| LOW | SELECTS INPUT CIRCUIT 8 | SELECTS OUTPUT SIGNAL OF ZERO-SIGNAL GENERATOR | SELECTS OUTPUT SIGNAL OF ZERO-SIGNAL GENERATOR | ... | SELECTS OUTPUT SIGNAL OF ZERO-SIGNAL GENERATOR |

*Fig.8B*

| CONTROL SIGNAL CS | SELECTOR 3A | SELECTOR 18₁ | SELECTOR 18₂ | ... | SELECTOR 18ₙ₋₁ |
|---|---|---|---|---|---|
| 11···11 | SELECTS INPUT CIRCUIT 7A | SELECTS OUTPUT SIGNAL OF DIFFERENTIATOR | SELECTS OUTPUT SIGNAL OF DIFFERENTIATOR | ... | SELECTS OUTPUT SIGNAL OF DIFFERENTIATOR |
| 11···10 | SELECTS INPUT CIRCUIT 8 | SELECTS OUTPUT SIGNAL OF DIFFERENTIATOR | SELECTS OUTPUT SIGNAL OF DIFFERENTIATOR | ... | SELECTS OUTPUT SIGNAL OF ZERO-SIGNAL GENERATOR |
| ·· | ·· | SELECTS OUTPUT SIGNAL OF ZERO-SIGNAL GENERATOR | ·· | ·· | ·· |
| 00···00 | SELECTS INPUT CIRCUIT m | | SELECTS OUTPUT SIGNAL OF ZERO-SIGNAL GENERATOR | ... | SELECTS OUTPUT SIGNAL OF ZERO-SIGNAL GENERATOR |

CASCADE-TYPE VARIABLE-ORDER DELTA-SIGMA MODULATOR

BACKGROUND OF THE INVENTION

1. Field of the Invention

The present invention relates to a cascade-type variable-order delta-sigma modulator. In particular, the present invention relates to a cascade-type variable-order delta-sigma modulator having quantization loops connected in a cascade configuration and changing the number of stages of the quantization loops depending on peripheral circuitries to be connected thereto.

2. Description of the Related Art

In recent years, an analog-to-digital converter and a digital-to-analog converter for use in a digital-audio device, including a delta-sigma modulator, are widely spread. The analog-to-digital converter and the digital-to-analog converter are combined with various circuits and integrated on a single substrate such as a LSI circuit (a large-scale integrated circuit) or the like, to reduce size, weight, and cost of the entire digital-audio device. The analog-to-digital converter is combined with an analog input circuit, such as a microphone input amplifying circuit, a line input circuit or the like. The digital-to-analog converter is combined with, for example, an amplifying circuit for a loudspeaker, a line output circuit or the like.

Performance of the entire digital-audio device is decided depending on the lowest signal-to-noise ratio (hereinafter, referred to as a SNR) among those of the delta-sigma modulator and peripheral circuitries combined with the delta-sigma modulator, such as an input circuit, an output circuit. Thereby, the SNR of the delta-sigma modulator should be higher than those of the peripheral circuitries. There is a demand for raising SNR of a delta-sigma modulator to realize a digital-audio device with high-performance as performance of the peripheral circuitries increases.

Although the SNR of the delta-sigma modulator can be raised by increasing the order of integrator in quantization loop incorporated in the delta-sigma modulator, a high order integrator causes instability of the operation of the delta-sigma modulator. In addition, although the SNR of the delta-sigma modulator can be raised by increasing the oversampling ratio, a high oversampling ratio narrows the bandwidth and causes a negative effect on transmission rate. Disclosed is a cascade-type delta-sigma modulator with stability and high-performance wherein a plurality of quantization loops, each having an integrator of relatively low order (e.g. second-order or less), are connected in a cascade configuration. (See Japanese patent laid-open publication No. 2004-080152.)

FIG. 10 shows a configuration of an analog-to-digital converter including a cascade-type delta-sigma modulator of a prior art. In FIG. 10, a selector 3 selects an input signal from an input circuit 1 or an input signal from an input circuit 2 in compliance with a control signal CS from a digital signal processor (DSP) 104 and transmits the selected signal to a delta-sigma modulator 107 as an analog input signal X. The delta-sigma modulator 107 includes a first quantization loop $10_1$ having a first-order integrator $13_1$, a subtracter $12_1$, a second quantization loop $10_2$ having a second-order integrator $13_2$, and a noise rejecting circuit 111.

The first quantization loop $10_1$, quantizes the analog input signal X by the first-order integrator $13_1$ and a quantizer $14_1$, and outputs a quantization signal Y1 to the noise rejecting circuit 111. The digital-to-analog converting unit $15_1$ converts the quantization signal Y1 to an analog signal before feeding a negative feedback to a subtracter 1311. The subtracter $12_1$ subtracts a signal level of an output signal of the digital-to-analog converting unit $15_1$ from a signal level of an output signal of the first-order integrator $13_1$, and outputs the subtraction result to the second quantization loop $10_2$ as a quantization error signal A.

The second quantization loop $10_2$ quantizes the quantization error signal A from the subtracter $12_1$ by the second-order integrator $13_2$ and a quantizer $14_2$, and outputs a quantization signal Y2. The digital-to-analog converting unit $15_2$ converts the quantization signal Y2 to an analog signal before feeding a negative feedback to subtracters 1321 and 1323.

The noise rejecting circuit 111 differentiates the quantization signal Y2 by a differentiator $17_1$, adds a signal level of the quantization signal Y1 to a signal level of the differentiated quantization signal Y2 by the adder $16_1$, and outputs a quantization signal Y which is the addition result to a digital filtering circuit 5.

As described above, the cascade-type delta-sigma modulator of the prior art has such a configuration that a plurality of the quantization loops, each having an integrator of relatively low order, are connected in a cascade configuration. In the cascade-type delta-sigma modulator of the prior art, the quantization error of the first quantization loop $10_1$ is inputted to the second quantization loop $10_2$, and thus, a high SNR is realized keeping stability of the delta-sigma modulator even if an oversampling rate is low.

BRIEF SUMMARY OF THE INVENTION

However, in the above-mentioned cascade-type delta-sigma modulator of the prior art, the number of stages of the quantization loops connected in a cascade configuration, is fixed independently of the SNR of the selected input circuit. Therefore, there is a problem that the number of stages of the quantization loops is not changed to an optimum number depending on peripheral circuitries to be connected.

In addition, when the SNR of the delta-sigma modulator is much higher than that of the selected input circuit, there is another problem that many integrators operate in the quantization loops, and as a result, wasteful power is consumed.

The present invention has as an object to provide a cascade-type variable-order delta-sigma modulator with low power consumption that can change the number of stages of the quantization loops connected in a cascade configuration depending on peripheral circuitries to be connected thereto, in a configuration as simple as possible. In order to solve the above-mentioned problems, the present invention has configurations described below.

According to the first aspect of the present invention, a cascade-type variable-order delta-sigma modulator includes first to $n^{th}$ stages of delta-sigma modulating type quantization loops (n is an integer equal to or more than 2) connected in a cascade configuration, and a noise rejecting circuit. Each quantization loop quantizes a signal inputted thereto, outputs the quantization result, and feeds the quantization result to itself as a feedback signal. The noise rejecting circuit is configured to receive respective output signals from the first to $n^{th}$ stages of quantization loops and a control signal, and to reject a quantization noise of the first stage of quantization loop. The noise rejecting circuit includes (n−1) first selectors for activating and de-activating the respective output signals of the second and succeeding stages of the quantization loops in compliance with the control signal.

According to this invention, in the delta-sigma modulator wherein a plurality of the quantization loops are connected in a cascade configuration, the (n−1) first selectors for activating and de-activating the respective output signals that is outputted from the second and succeeding stages of quantization loops are provided. Thereby, it is possible to realize a cascade-type variable-order delta-sigma modulator changing the number of stages of the quantization loops connected in a cascade configuration depending on the SNR of peripheral circuitries to be connected thereto.

According to the second aspect of the present invention, further in the cascade-type variable-order delta-sigma modulator according to the above-mentioned first aspect of the present invention, the first stage of the quantization loop includes a first integrator, a first quantizer, and a first converter. Each of the second and succeeding stages of the quantization loops includes a second integrator, a second quantizer, and a second converter. The first integrator integrates a difference between an analog input signal inputted from an input circuit and a first feedback signal and outputs the integration result. The first quantizer quantizes an output signal of the first integrator and outputs the quantization result. The first converter generates the first feedback signal from an output signal of the first quantizer and outputs the first feedback signal. The second integrator integrates a difference between a quantization error of a previous stage of the quantization loop and a second feedback signal and outputs the integration result. The second quantizer quantizes an output signal of the second integrator and outputs the quantization result. The second converter generates the second feedback signal from an output signal of the second quantizer and outputs the second feedback signal.

According to this invention, it is possible to realize a delta-sigma variable-order delta-sigma modulator for use in an analog-to-digital converter that receives an analog signal due to the above-mentioned configuration.

According to the third aspect of the present invention, further in the cascade-type variable-order delta-sigma modulator according to the above-mentioned second aspect of the present invention, a second selector is further included. The second selector selects one signal of signals inputted from a plurality of input circuits in compliance with the control signal and transmits the selected signal to the first stage of the quantization loop.

According to this invention, the second selector for selecting one signal of the signals inputted from a plurality of the input circuits is provided. Thereby, it is possible to realize a cascade-type variable-order delta-sigma modulator changing the number of stages of the quantization loops to the optimum number depending on the SNR of the selected input circuit.

According to the fourth aspect of the present invention, further in the cascade-type variable-order delta-sigma modulator according to the above-mentioned first aspect of the present invention, the first stage of the quantization loop includes a first integrator and a first quantizer. Each of the second and succeeding stages of the quantization loops includes a second integrator and a second quantizer. The first integrator integrates a difference between a digital input signal inputted from an input circuit and a first feedback reference level and outputs the integration result. The first quantizer quantizes an output signal of the first integrator and outputs the quantization result as the first feedback reference level. The second integrator integrates a difference between a quantization error of a previous stage of the quantization loop and a second feedback reference level and outputs the integration result. The second quantizer quantizes an output signal of the second integrator and outputs the quantization result as the second feedback reference level.

According to this invention, it is possible to realize a delta-sigma variable-order delta-sigma modulator for use in a digital-to-analog converter that receives a digital signal due to the above-mentioned configuration.

According to the fifth aspect of the present invention, further in the cascade-type variable-order delta-sigma modulator according to the above-mentioned fourth aspect of the present invention, a second selector is further included. The second selector selects one output circuit of a plurality of output circuits in compliance with the control signal and transmits a quantization signal from the noise rejecting circuit to the selected output circuit.

According to this invention, it is possible to realize a cascade-type variable-order delta-sigma modulator changing the number of stages of the quantization loops to the optimum number depending on the SNR of selected output circuit due to the second selector.

According to the sixth aspect of the present invention, further in the cascade-type variable-order delta-sigma modulator according to the above-mentioned first or second or fourth aspect of the present invention, the noise rejecting circuit includes (n−1) differentiators and (n−1) adders. The (n−1) differentiators are provided at respective output terminals of the (n−1) first selectors. The differentiators respectively differentiate output signals of the (n−1) first selectors. The (n−1) adders sum signal levels of output signals of the (n−1) differentiators and a signal level of an output signal of the first stage of the quantization loop.

According to the seventh aspect of the present invention, further in the cascade-type variable-order delta-sigma modulator according to the above-mentioned first or second or fourth aspect of the present invention, the noise rejecting circuit includes (n−1) differentiators and (n−1) adders. The (n−1) differentiators are provided at respective input terminals of the (n−1) first selectors. The differentiators respectively differentiate output signals of the second and succeeding quantization loops. The (n−1) adders summing signal levels of output signals of the (n−1) first selectors and a signal level of an output signal of the first stage of the quantization loop.

According to these inventions, the noise rejecting circuit can reject a quantization error of the first quantization loop due to the above-mentioned configuration.

According to the eighth aspect of the present invention, further in the cascade-type variable-order delta-sigma modulator according to the above-mentioned first or second or fourth aspect of the present invention, each of the second and succeeding stages of the quantization loops switches over an operating state and a stopping state in compliance with the control signal.

According to this invention, unused quantization loops among the second and succeeding stages of the quantization loops get into the stopping state, and therefore, a power having been consumed by the unused quantization loops in the prior art can be reduced. Therefore, a power consumption of the entire cascade-type variable-order delta-sigma modulator is reduced. As a result, a cascade-type variable-order delta-sigma modulator with low power consumption can be realized.

According to the ninth aspect of the present invention, further in the cascade-type variable-order delta-sigma modulator according to the above-mentioned eighth aspect of the present invention, each of the second and succeeding stages of the quantization loops supplies and blocks a bias current or a bias voltage to each of the second and succeeding stages of the quantization loops in compliance with the control signal to switch over an operating state and a stopping state.

According to this invention, a bias current or a bias voltage to be supplied to the unused quantization loops among the second and succeeding stages of the quantization loops is blocked, and therefore, a power having been consumed by the unused quantization loops in the prior art can be reduced. Therefore, a power consumption of the entire cascade-type variable-order delta-sigma modulator is reduced. As a result, a cascade-type variable-order delta-sigma modulator with low power consumption can be realized.

According to the tenth aspect of the present invention, further in the cascade-type variable-order delta-sigma modulator according to the above-mentioned eighth aspect of the present invention, each of the second and succeeding stages of the quantization loops includes a switched-capacitor circuit and a logic decision circuit. The switched-capacitor circuit has a plurality of switches and a capacitor. The logic decision circuit fixes the switches of the switched-capacitor circuit in a certain state when making each of the second and succeeding stages of the quantization loops be in the stopping state in compliance with the control signal.

According to this invention, the logic decision circuit controls the switches in the switched capacitor circuit of the unused quantization loops among the second and succeeding stages of the quantization loops, so that the switches are fixed in a certain state, and therefore, a power having been consumed by the unused quantization loops in the prior art can be reduced. Therefore, a power consumption of the entire cascade-type variable-order delta-sigma modulator is reduced. As a result, a cascade-type variable-order delta-sigma modulator with low power consumption can be realized.

According to the eleventh aspect of the present invention, further in the cascade-type variable-order delta-sigma modulator according to the above-mentioned eighth aspect of the present invention, a controller is further included. The controller generates the control signal for controlling the first selector and for switching over an operating state and a stopping state of the second and succeeding stages of the quantization loops.

According to this invention, it is possible to realize a cascade-type variable-order delta-sigma modulator changing the number of stages of the quantization loops connected in a cascade configuration to the optimum number depending on peripheral circuitries to be connected thereto, and having a function of generating the control signal for making the quantization loops be in the operating state or the stopping state.

The cascade-type variable-order delta-sigma modulator according to the present invention has an advantageous effect that it is possible to realize a cascade-type variable-order delta-sigma modulator with low power consumption that can change the number of stages of the quantization loops connected in a cascade configuration to the optimum number depending on peripheral circuitries to be connected thereto, in a configuration as simple as possible.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 5A and 5B are tables showing states of respective selectors in a noise rejecting circuit in accordance with the second preferred embodiment of the present invention;

FIGS. 8A and 8B are tables showing states of respective selectors in a noise rejecting circuit in accordance with the fourth preferred embodiment of the present invention;

DETAILED DESCRIPTION OF THE PREFERRED EMBODIMENTS

Preferred embodiments specifically exemplifying the best mode for carrying out the present invention will be described below referring to the accompanying drawings.

First Preferred Embodiment

Figure 1:
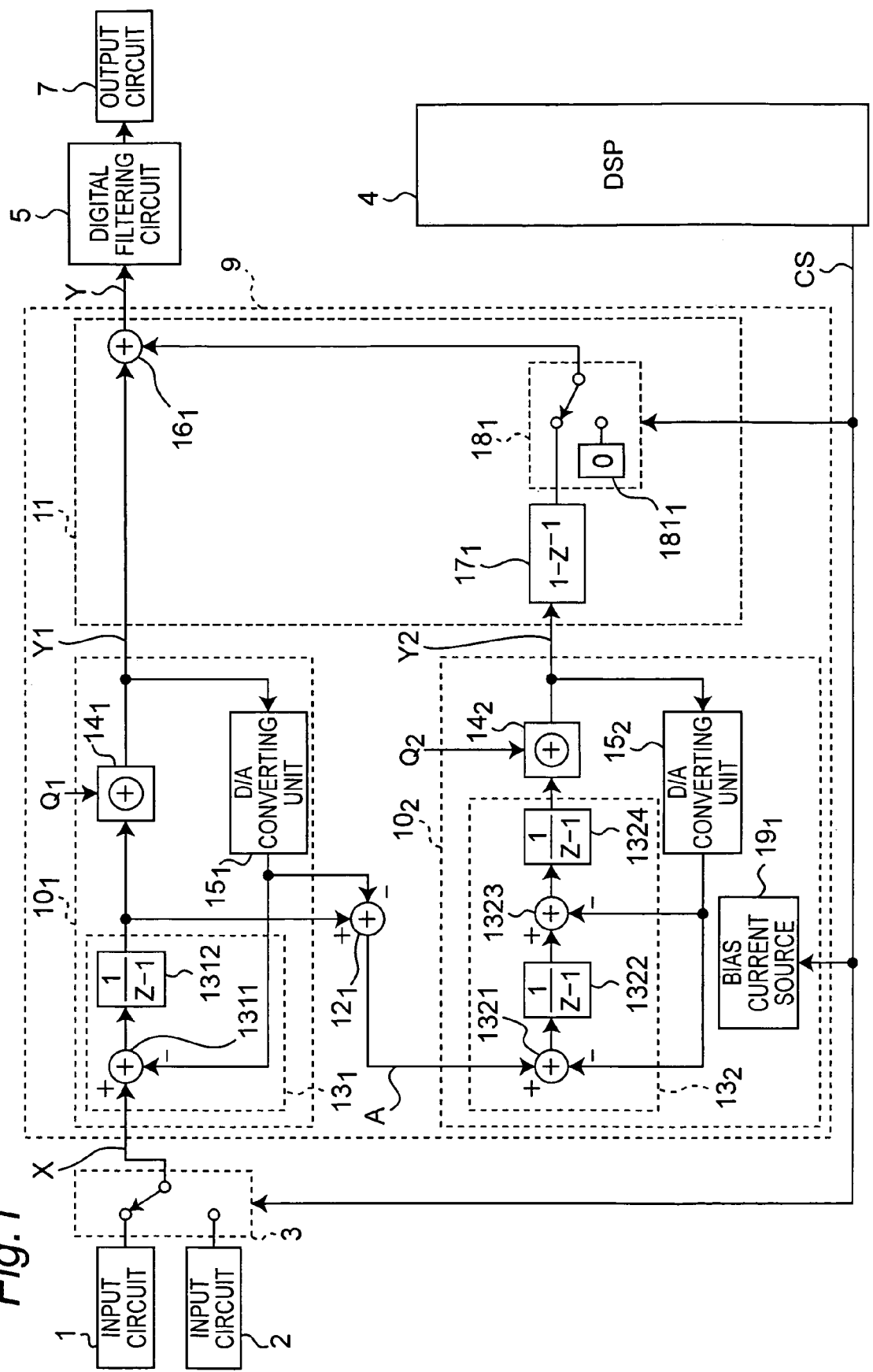
FIG. 1 is a block diagram showing a configuration of an analog-to-digital converter including a cascade-type variable-order delta-sigma modulator in accordance with a first preferred embodiment of the present invention.
Figure 2:
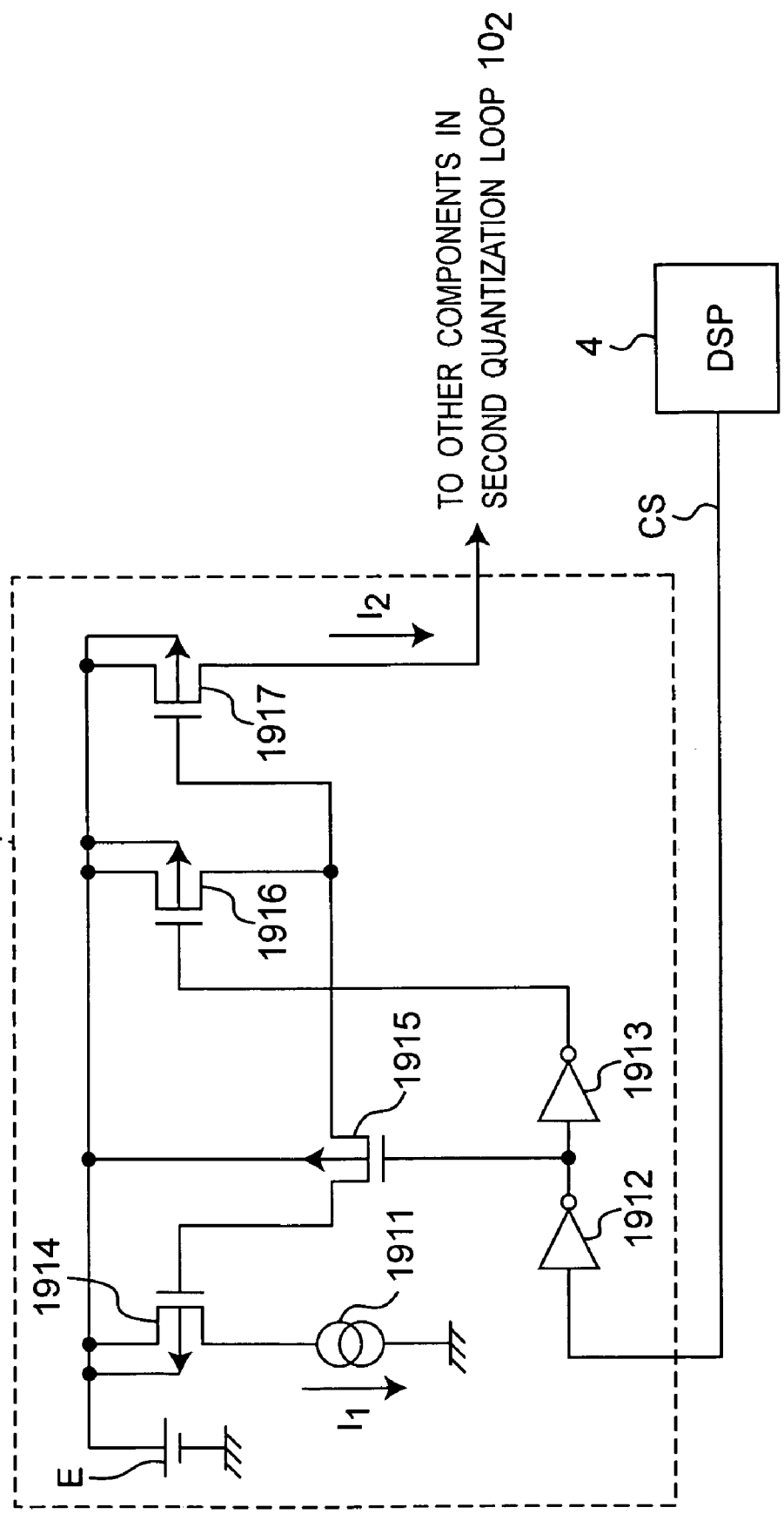
FIG. 2 is a circuit diagram showing a detailed configuration of a bias current source in accordance with the first preferred embodiment of the present invention.
Figure 3:
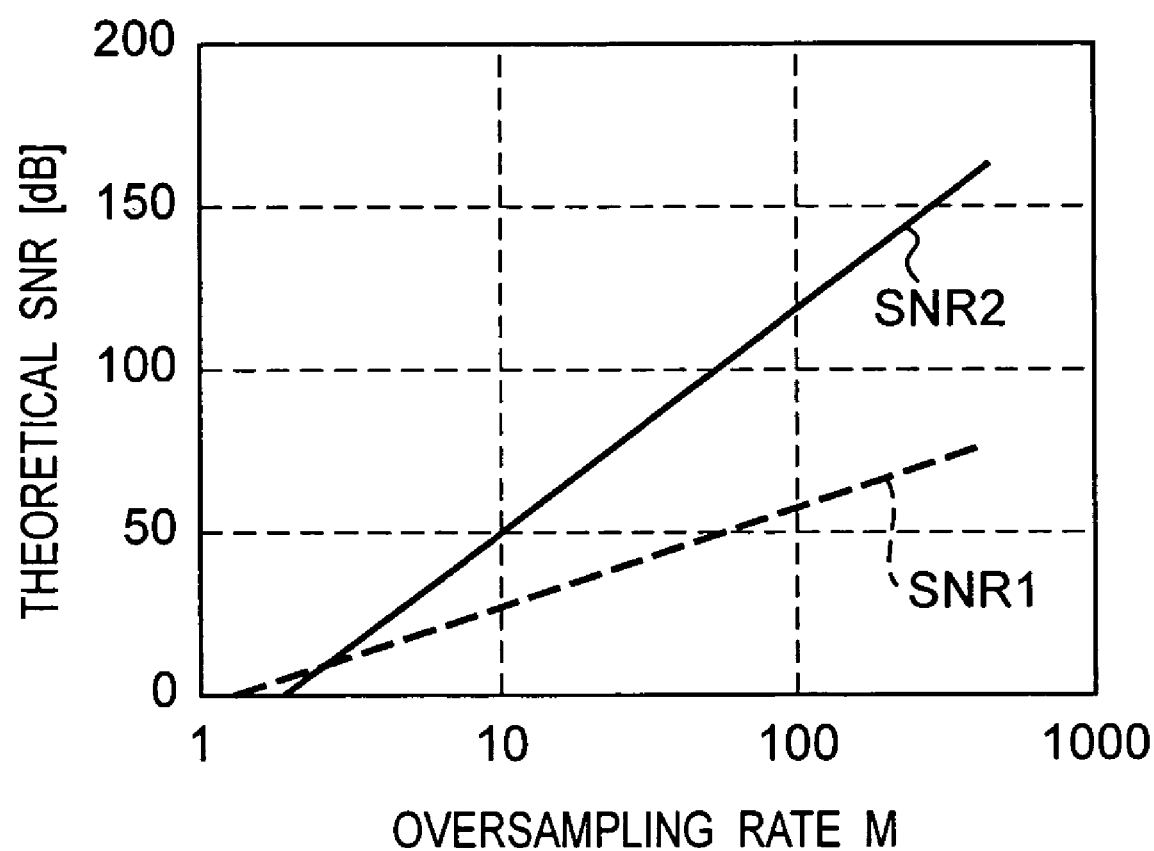
FIG. 3 is a diagram showing respective relationships of an oversampling rate and a theoretical SNR for a delta-sigma modulator configured only by a quantization loop having a first order integrator and for a delta-sigma modulator configured by a quantization loop having a first-order integrator and a quantization loop having a second-order integrator, which are connected in a cascade configuration.

Referring to FIGS. 1 to 3, a cascade-type variable-order delta-sigma modulator in accordance with a first preferred embodiment will be described. FIG. 1 is a block diagram showing a configuration of an analog-to-digital converter including the cascade-type variable-order delta-sigma modulator in accordance with the first preferred embodiment of the present invention. In FIG. 1, the analog-to-digital converter includes a selector 3, a delta-sigma modulator 9, a digital filtering circuit 5, and a digital signal processor (hereinafter referred to as DSP) 4.

Input circuits 1 and 2 are analog input circuits, each of which outputs an analog signal. For example, the input circuit 1 is a microphone input amplifying circuit; and the input circuit 2 is a line input circuit. Signal-to-noise ratios (SNRs) of both input circuits differ from each other. An output circuit 7 is, for example, a circuit for recording digital data converted to digital audio data to a recording medium.

The DSP 4 is connected to the selector 3 and the delta-sigma modulator 9. The DSP 4 is a controller that outputs a control signal CS for controlling the selector 3 and the delta-sigma modulator 9 depending on a SNR of a selected input circuit.

The selector 3 is provided between the input circuits 1 and 2, and the delta-sigma modulator 9. The selector 3 selects a signal from the input circuit 1 or a signal from the input circuit 2 in compliance with the control signal CS from the DSP 4, and transmits the selected signal to the delta-sigma modulator 9 as an analog input signal X.

The delta-sigma modulator 9 includes a first quantization loop $10_1$, a subtracter $12_1$, a second quantization loop $10_2$, and a noise rejecting circuit 11. The delta-sigma modulator 9 receives the analog input signal X, quantizes the analog input signal X by two stages of the quantization loops, rejects a quantization noise by the noise rejecting circuit 11, and outputs a quantization signal Y to the digital filtering circuit 5. Each of the first and second quantization loops $10_1$ and $10_2$ quantizes a signal inputted thereto, outputs the quantization result, and feeds the quantization result to itself as a feedback signal.

The first quantization loop $10_1$ includes a first-order differentiator $13_1$ having a subtracter 1311 and an integrator 1312, a quantizer $14_1$, and a digital-to-analog converting unit $15_1$. The subtracter 1311 subtracts a signal level of an output signal of the digital-to-analog converting unit $15_1$ from a signal level of the analog input signal X, and outputs the subtraction result to the integrator 1312. The integrator 1312 integrates an output signal from the subtracter 1311, and output the integration result to the quantizer $14_1$ and the subtracter $12_1$. The quantizer $14_1$ quantizes an output signal from the integrator 1312 using a quantization frequency $Q_1$, which is inputted from outside, and outputs the quantized signal to the digital-to-analog converting unit $15_1$ and the noise rejecting circuit 11 as a quantization signal Y1. The digital-to-analog converting unit $15_1$ converts the quantization signal Y1 to an analog signal, and outputs the converted analog signal to the subtracters 1311 and $12_1$. The output signal from the digital-to-analog converting unit $15_1$ is also a feedback signal to be fed to the subtracter 1311.

The subtracter $12_1$ subtracts a signal level of an output signal of the digital-to-analog converting unit $15_1$ from a signal level of an output signal of the integrator 1312, and outputs the subtraction result to the second quantization loop $10_2$ as a quantization error signal A.

The second quantization loop $10_2$ includes a second-order integrator $13_2$ having a subtracter 1321, an integrator 1322, a subtracter 1323, and an integrator 1324, a quantizer $14_2$, a digital-to-analog converting unit $15_2$, and a bias current source $19_1$. The subtracter 1321 subtracts a signal level of an output signal of the digital-to-analog converting unit $15_2$ from a signal level of the quantization error signal A outputted from the subtracter $12_1$, and outputs the subtraction result to the integrator 1322. The integrator 1322 integrates an output signal from the subtracter 1321, and outputs the integration result to the subtracter 1323. The subtracter 1323 subtracts a signal level of an output signal from the digital-to-analog converting unit $15_2$ from a signal level of an output signal outputted from the integrator 1322, and outputs the subtraction result to the integrator 1324. The integrator 1324 integrates the subtraction result from the subtracter 1323, and outputs the integration result to the quantizer $14_2$. The quantizer $14_2$ quantizes an output signal from the integrator 1324 using a quantization frequency $Q_2$, which is inputted from outside, and outputs a quantized signal to the digital-to-analog converting unit $15_2$ and the noise rejecting circuit 11 as a quantization signal Y2. The digital-to-analog converting unit $15_2$ converts the quantization signal Y2 to an analog signal, and outputs the converted analog signal to the subtracters 1321 and 1323. The output signal from the digital-to-analog converting unit $15_2$ is also a feedback signal to be fed to the subtracters 1321 and 1323.

The bias current source $19_1$ supplies or blocks a bias current flowing in the second quantization loop $10_2$ in compliance with the control signal CS from the DSP 4 (as will hereinafter be described in detail).

The noise rejecting circuit 11 includes an adder $16_1$, a differentiator $17_1$, and a selector $18_1$. The differentiator $17_1$ differentiates the quantization signal Y2, which is the output signal from the second quantization loop $10_2$, and outputs the differentiated signal to the selector $18_1$. The selector $18_1$ includes a zero-signal generator $181_1$. The selector $18_1$ activates or de-activates the output signal of the differentiator $17_1$ by selecting the output signal of the differentiator $17_1$ or an output signal (zero-signal) of the zero-signal generator $181_1$ in compliance with the control signal CS from the DSP 4. The adder $16_1$ adds a signal level of the quantization signal Y1, which is the output signal from the first quantization loop $10_1$, to a signal level of the signal selected by the selector $18_1$. The noise rejecting circuit 11 outputs an output signal of the adder $16_1$ to the digital filtering circuit 5 as a quantization signal Y.

The digital filtering circuit 5 is connected to the output terminal of the delta-sigma modulator 9. The digital filtering circuit 5 rejects a quantization noise of the quantization signal Y, which is shifted out to higher frequency region by the noise shaping of the delta-sigma modulator 9, and outputs the signal to the output circuit 7.

Operation of the analog-to-digital converter including the cascade-type variable-order delta-sigma modulator in accordance with the first preferred embodiment will be described below.

The input circuit 1 has a high SNR, and therefore, the delta-sigma modulator 9 is also required to have a high SNR in the case in which the input circuit 1 is selected as the circuit to be connected. In this case, the DSP 4 outputs the control signal CS of high level. The selector 3 selects the output signal of the input circuit 1, and transmits the selected signal to the delta-sigma modulator 9 as the analog input signal X. The bias current source $19_1$ of the second quantization loop $10_2$ supplies a bias current in the second quantization loop $10_2$. The selector $18_1$ selects the output signal of the differentiator $17_1$, and transmits the selected signal to the adder $16_1$.

Therefore, the quantization signal Y2, which is the output signal of the second quantization loop $10_2$, is activated, and so, the delta-sigma modulator 9 has such a configuration that the first quantization loop $10_1$ having the first-order integrator and the second quantization loop $10_2$ having the second-order integrator are connected in a cascade configuration.

According to this configuration, by giving the quantization error of the first quantization loop $10_1$ to the second quantization loop $10_2$, the quantization noise can be shifted out to higher frequency region. As a result, the delta-sigma modulator realizing a high SNR can be obtained.

On the other hand, a SNR of the input circuit 2 is much lower than that of the input circuit 1, and therefore, the delta-sigma modulator 9 just has to have a low SNR in the case in which the input circuit 2 is selected as the circuit to be connected. Therefore, the number of stages of the quantization loops of the delta-sigma modulator is decreased, to reduce the power consumption. In this case, the DSP 4 outputs the control signal CS of low level. The selector 3 selects the output signal of the input circuit 2, and transmits the selected signal to the delta-sigma modulator 9 as the analog input signal X. The bias current source $19_1$ of the second quantization loop $10_2$ blocks the bias current in the second quantization loop $10_2$. The selector $18_1$ selects the output signal of the zero-signal generator $181_1$, and transmits the selected signal to the adder $16_1$.

Therefore, the quantization signal Y2, which is the output signal of the second quantization loop $10_2$, is de-activated. As a result, the delta-sigma modulator 9 is substantially configured only by the first quantization loop $10_1$ having the first-order integrator.

In this case, the bias current is blocked in the second quantization loop $10_2$, and therefore, it is prevented that wasteful power having been consumed by unused second quantization loop $10_2$ is consumed. As a result, the power consumption of the delta-sigma modulator can be reduced in comparison with the prior art.

FIG. 3 is a diagram showing relationships of an oversampling rate and a theoretical SNR for a delta-sigma modulator configured only by the quantization loop $10_1$ having a first order integrator, and for a delta-sigma modulator configured by the first quantization loop $10_1$ having a first-order integrator and the second $10_2$ quantization loop having a second-order integrator, which are connected in a cascade configuration. FIG. 3 is in the case in which commonly used 1-bit quantizers are used.

The theoretical SNR (SNR1) for the delta-sigma modulator configured only by the quantization loop $10_1$ and the theoretical SNR (SNR2) for a delta-sigma modulator configured by the first and second quantization loops $10_1$ and $10_2$, which are connected in a cascade configuration, are represented by the following equations (1) and (2), respectively. In the following equations (1) and (2), M is the oversampling rate.

$$SNR1 = 30 \cdot \log M - 3.4 \quad (1)$$

$$SNR2 = 70 \cdot \log M - 19.6 \quad (2)$$

In compliance with the above-mentioned equations (1) and (2), when the oversampling rate M is 128, for example, the SNR1 and the SNR2 are approximately 60 dB and 128 dB, respectively, as shown in FIG. 3. Therefore, the SNR of the cascade-type delta-sigma modulator wherein the two quantization loops $10_1$ and $10_2$ are connected in a cascade configuration is high in comparison with that of the delta-sigma modulator configured only by the quantization loop $10_1$ even if the oversampling rate M is low.

Referring to FIG. 2, the bias current source $19_1$ will be described. The bias current source $19_1$ is an example of a specific configuration for supplying and blocking the bias current flowing in the second quantization loop $10_2$.

In FIG. 2, the bias current source $19_1$ includes a constant current source 1911, inverters 1912 and 1913, and switches 1914 to 1917. The respective switches 1914 to 1917 are, for example, P-channel type MOS transistors.

The bias current source $19_1$ includes a current mirror circuit consisting of the constant current source 1911 and the switches 1914 and 1917. Due to this configuration, a bias current $I_2$, which is equal to a bias current $I_1$ produced by the voltage source E and flowing in the constant current source 1911, is supplied to the second quantization loop $10_2$. By controlling the switches 1915 and 1916 to control the operation of the current mirror circuit, the bias current $I_2$ is supplied or blocked.

When the control signal CS of high level is inputted from the DSP 4, the switches 1914, 1915, and 1917 are turned ON, and the switch 1916 is turned OFF. The bias current $I_2$ which is equal to the bias current $I_1$ flowing in the constant current source 1911 is supplied, and therefore, the second quantization loop $10_2$ becomes an operating state.

When the control signal CS of low level is inputted from the DSP 4, the switches 1914, 1915, and 1917 are turned OFF, and the switch 1916 is turned ON. The bias current $I_2$ is blocked (that is, a current value is zero), and therefore, the second quantization loop $10_2$ becomes a stopping state.

As described above, the analog-to-digital converter using the delta-sigma modulator 9 in accordance with the first preferred embodiment has the selector $18_1$, to activate or de-activate the quantization signal Y2, which is the output signal of the second quantization loop $10_2$. Thereby, the number of stages of the quantization loops connected in a cascade configuration is changed depending on the selected input circuit, so that the SNR of the delta-sigma modulator 9 becomes the desired SNR.

When the selector $18_1$ de-activates the output signal of the second quantization loop $10_2$, the bias current to be supplied to the second quantization loop $10_2$ is blocked, so that the second quantization loop $10_2$ becomes the stopping state. Thereby, a power having been consumed by the unused second quantization loop in the prior art can be reduced, and the consumption power of the entire delta-sigma modulator 9 can be reduced. Thus, a cascade-type variable-order delta-sigma modulator with low power consumption can be realized.

The first-order integrator $13_1$ is included in the first quantization loop $10_1$, and the second-order integrator $13_2$ is included in the second quantization loop $10_2$. However, the present invention is not limited to this configuration. The first-order integrators or the second order integrators may be included in the respective quantization loops, or alternatively the second-order integrator may be included in the first quantization loop $10_1$ and the first-order integrator may be included in the second quantization loop $10_2$. The configuration disclosed in the first preferred embodiment does not intend to limit the order of the integrators.

Figure 9:
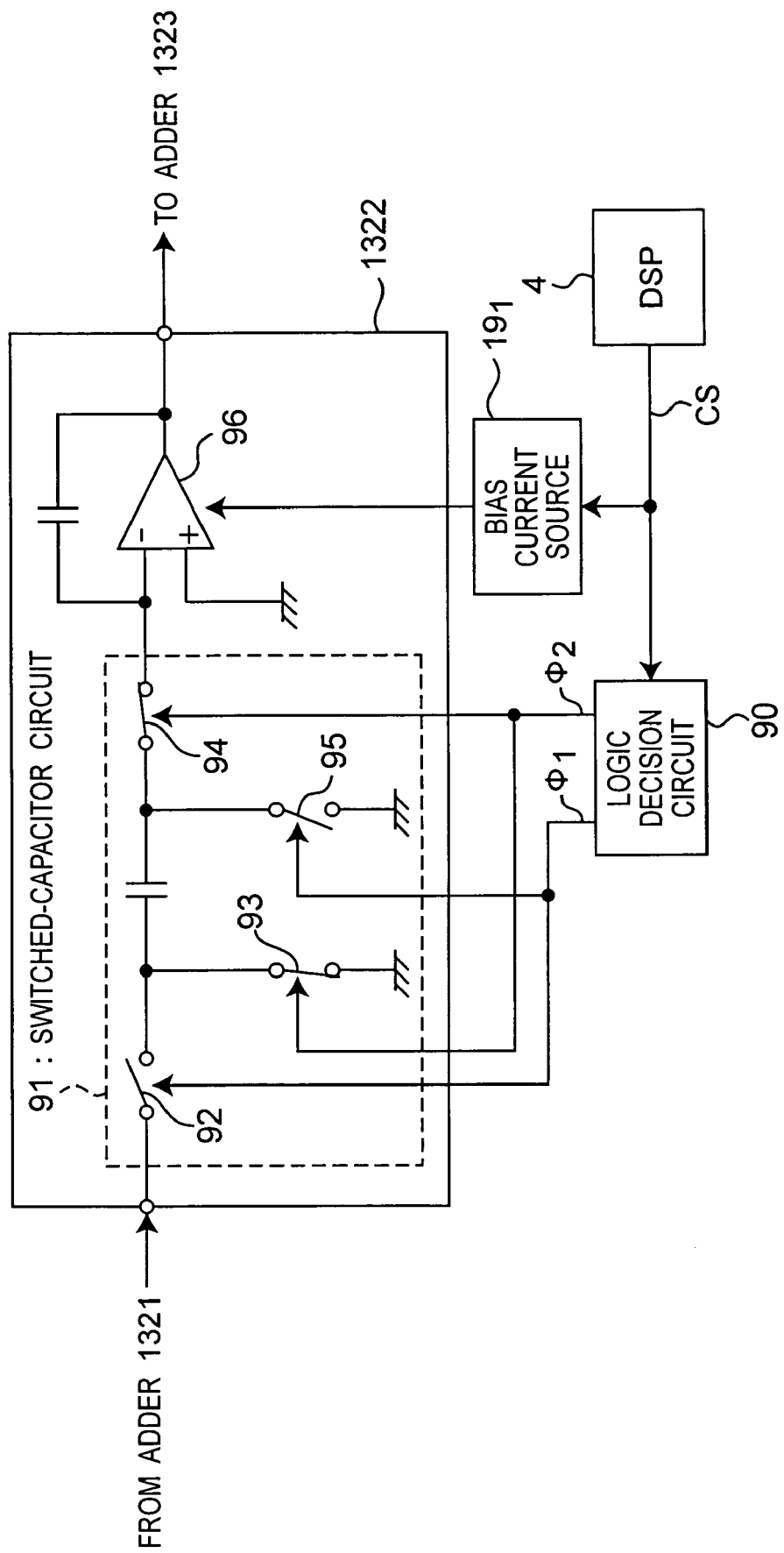
FIG. 9 is a circuit diagram showing a detailed configuration of an integrator in accordance with each preferred embodiment of the present invention.
Figure 10:
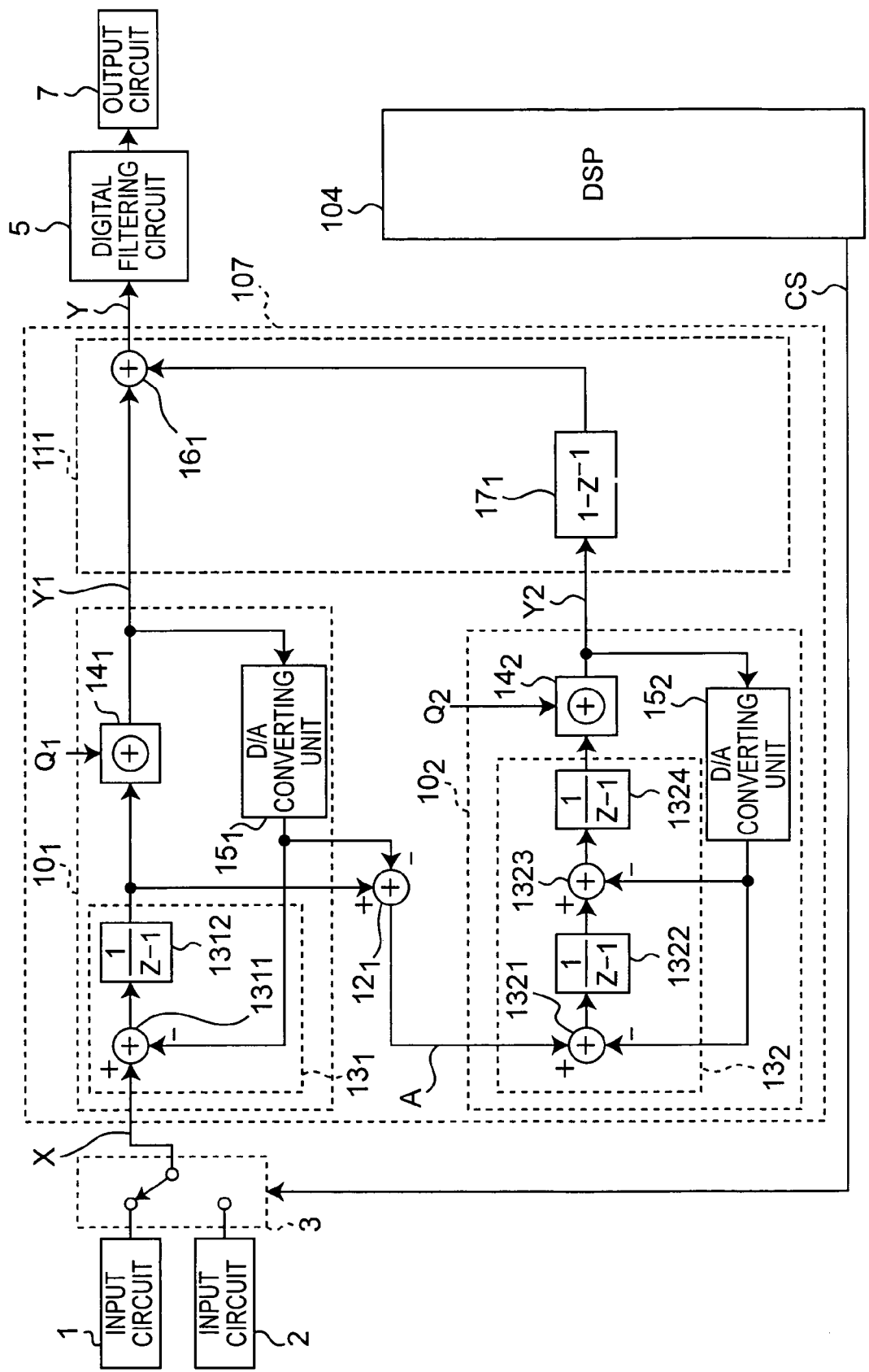
FIG. 10 is a block diagram showing a configuration of an analog-to-digital converter including a cascade-type delta-sigma modulator of a prior art.

In the first preferred embodiment, the bias current source $19_1$ for supplying or blocking the bias current is described as an example of a means for stopping the operation of the second quantization loop $10_2$ on the purpose of reduction of the consumption power. However, the present invention is not limited to this configuration. Such a configuration that a bias voltage instead of the bias current is blocked brings the same effect as the first preferred embodiment. In addition, if the integrators 1322 and 1324 in the second quantization loop $10_2$ are configured as shown in FIG. 9 (illustrating only the integrator 1322), it is possible to employ such a configuration that switches in a switched-capacitor circuit 91 consisted of the integrator are controlled so as to stop the operation of the second quantization loop $10_2$. In this case, a logic decision circuit 90 outputs a control signal $\Phi_1$ for controlling switches 92 and 95 and a control signal $\Phi_2$ for controlling switches 93 and 94 in compliance with the control signal CS from the DSP 4. The logic decision circuit 90 outputs the control signal $\Phi_1$ for turning the switches 92 and 95 OFF and the control signal $\Phi_2$ for turning the switches 93 and 94 ON to prevent an input terminal of the switched-capacitor circuit 91 from short-circuiting to the ground potential when the second quantization loop $10_2$ is to be in the stopping state. The voltage at the input terminal of an operational amplifier 96 is fixed at a constant value, and therefore, the operation of the second quantization loop $10_2$ can be stopped. In addition, a power having been consumed by the unused quantization loops in the prior art can be reduced by blocking the bias current or the bias voltage supplied to an operational amplifier 96. The same is true for the following preferred embodiments.

Second Preferred Embodiment

Figure 4:
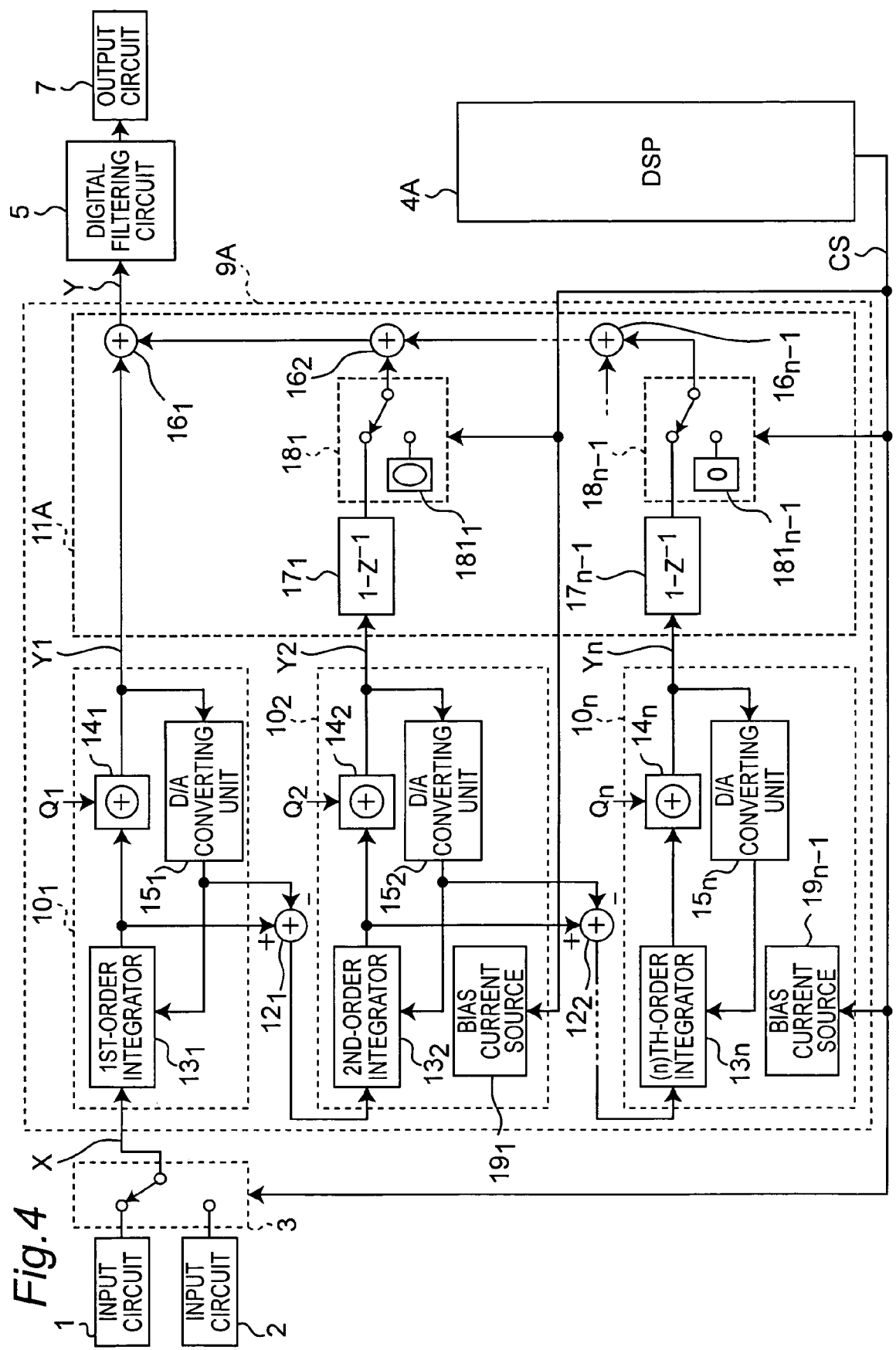
FIG. 4 is a block diagram showing a configuration of an analog-to-digital converter including a cascade-type variable-order delta-sigma modulator in accordance with a second preferred embodiment of the present invention.

Referring to FIGS. 4 and 5, a cascade-type variable-order delta-sigma modulator in accordance with a second preferred embodiment will be described. FIG. 4 is a block diagram showing a configuration of an analog-to-digital converter including the cascade-type variable-order delta-sigma modulator in accordance with the second preferred embodiment of the present invention. In FIG. 4, the analog-to-digital converter according to the second preferred embodiment is different from the first preferred embodiment in that a delta-sigma modulator 9A is provided in place of the delta-sigma modulator 9, and a DSP 4A is provided in place of the DSP 4. In other respects, the configuration is similar to that of the first preferred embodiment shown in FIG. 1, components similar or equivalent to those of the first preferred embodiment are designated by the same numeral references as those in FIG. 1, and their descriptions are omitted.

The delta-sigma modulator 9A includes first to $n^{th}$ stages of quantization loops $10_1$ to $10_n$ (n is an integer equal to or more than 2), subtracters $12_1$ to $12_{n-1}$ provided between respective quantization loops, and a noise rejecting circuit 11A. The first to $n^{th}$ stages of quantization loops $10_1$ to $10_n$ have first-order to $n^{th}$-order integrators $13_1$ to $13_n$, quantizers $14_1$ to $14_n$, and digital-to-analog converting units $15_1$ to $15_n$, respectively. Further, the second and succeeding stages of the quantization loops $10_2$ to $10_n$ have bias current sources $19_1$ to $19_{n-1}$, respectively.

The quantization loops $10_3$ to $10_n$ of the delta-sigma modulator 9A are similar in configuration and operation to the second quantization loop $10_2$, which is described in detail in the first preferred embodiment except in that the order of the integrators is different from each other, and therefore, their detailed descriptions are omitted. The subtracters $12_2$ to $12_{n-1}$ are similar in configuration and operation to the subtracter $12_2$ in the first preferred embodiment, and therefore, their detailed descriptions are omitted.

The noise rejecting circuit 11A includes (n−1) differentiators $17_1$ to $17_{n-1}$, (n−1) selectors $18_1$ to $18_{n-1}$, and (n−1) adders $16_1$ to $16_{n-1}$. The differentiators $17_1$ to $17_{n-1}$ differentiate respective output signals Y2 to Yn of the second to succeeding stages of quantization loops $10_2$ to $10_n$. The selectors $18_1$ to $18_{n-1}$ activate or de-activate output signals of the respective differentiators by selecting the respective output signals of the differentiators or respective output signals of zero-signal generators $181_1$ to $181_{n-1}$. The adders $16_1$ to $16_{n-1}$ are provided to sum signal levels of the output signals of respective selectors and signal level of the output signal of the first stage of the quantization loop $10_1$.

The DSP 4A is connected to the selector 3 and the delta-sigma modulator 9A. The DSP 4 is a controller that outputs a control signal CS for controlling the selector 3 and the delta-sigma modulator 9A depending on the SNR of a selected input circuit.

Operation of the analog-to-digital converter including the cascade-type variable-order delta-sigma modulator in accordance with the second preferred embodiment will be described below with reference to FIG. 5A.

The input circuit 1 has a high SNR, and therefore, the delta-sigma modulator 9A is also required to have a high SNR in the case in which the input circuit 1 is selected as the circuit to be connected. In this case, as shown in FIG. 5A, the DSP 4A outputs the control signal CS of high level. The selector 3 selects the output signal of the input circuit 1, and transmits the selected signal to the delta-sigma modulator 9A as the analog input signal X. The bias current sources $19_1$ to $19_{n-1}$ supply a bias current in the second and succeeding quantization loops $10_2$ to $10_{n-1}$, respectively. The respective selectors $18_1$ to $18_{n-1}$ select the output signals of the differentiators $17_1$ to $17_{n-1}$, and transmit the selected signal to the adders.

Therefore, the quantization signals Y2 to Yn, which are the output signals of the second and succeeding stages of the quantization loops $10_2$ to $10_n$, are activated, and so, the delta-sigma modulator 9A has such a configuration that n-number of quantization loops $10_1$ to $10_n$ respectively having the first-order to $n^{th}$-order integrators are connected in a cascade configuration.

According to this configuration, by giving the quantization error of the previous quantization loop to the next quantization loop, the quantization noise can be shifted out to higher frequency region. As a result, the delta-sigma modulator realizing a high SNR can be obtained. The larger the number of stages (n) is, the higher the SNR is.

On the other hand, a SNR of the input circuit 2 is much lower than that of the input circuit 1, and therefore, the delta-sigma modulator 9A just has to have a low SNR in the case in which the input circuit 2 is selected as the circuit to be connected. Therefore, the number of stages of the quantization loops of the delta-sigma modulator is decreased, to reduce the power consumption. In this case, the DSP 4A outputs the control signal CS of low level. The selector 3 selects the output signal of the input circuit 2, and transmits the selected signal to the delta-sigma modulator 9A as the analog input signal X. The bias current sources $19_1$ to $19_{n-1}$ block the bias current in the second and succeeding stages of quantization loop $10_2$ to $10_n$, respectively. The selectors $18_1$ to $18_{n-1}$ select the output signals of the zero-signal generators $181_1$ to $181_{n-1}$, respectively, and transmit the selected signals to the adders.

Therefore, the quantization signals Y2 to Yn, which are the output signals of the second and succeeding stages of quantization loops $10_2$ to $10_n$, are de-activated. As a result, the delta-sigma modulator 9A is substantially configured only by the first quantization loop $10_1$ having the first-order integrator.

In this case, the bias current is blocked in the second and succeeding stages of quantization loops $10_2$ to $10_n$, and therefore, it is prevented that wasteful power having been consumed by unused second and succeeding stages of quantization loops $10_2$ to $10_n$ is consumed. As a result, the power consumption of the delta-sigma modulator can be reduced in comparison with the prior art. The specific means for supplying and blocking the bias current in the second and succeeding stages of quantization loops $10_2$ to $10_n$ has been already described in the first preferred embodiment with reference to FIG. 9.

As described above, the analog-to-digital converter using the delta-sigma modulator 9A in accordance with the second preferred embodiment has such a configuration that three or more stages of quantization loops are connected in a cascade configuration. The analog-to-digital converter has the selectors $18_1$ to $18_{n-1}$, to activate or de-activate the quantization signals Y2 to Yn which are the output signals of the second and succeeding stages of quantization loops $10_2$ to $10_n$. Thereby, the number of stages of the quantization loops connected in a cascade configuration is changed depending on the selected input circuit, so that the SNR of the delta-sigma modulator 9A becomes the desired SNR.

When the selectors $18_1$ to $18_{n-1}$ de-activate the output signals of the second and succeeding stages of quantization loops $10_2$ to $10_n$, the bias current to be supplied to the second and succeeding stages of quantization loops $10_2$ to $10_n$ is blocked, so that the second and succeeding stages of quantization loops $10_2$ to $10_n$ are in the stopping state. Thereby, a power having been consumed by the unused second and succeeding stages of quantization loops in the prior art can be reduced to a large degree, and the consumption power of the entire delta-sigma modulator 9A can be reduced. Thus, a cascade-type variable-order delta-sigma modulator with low power consumption can be realized. The larger the number of stages of quantization loops (n) is, the larger the effect of the reduction of the power consumption is.

The first-order to $n^{th}$-order integrators are included in the first to $n^{th}$ stages of quantization loops $10_1$ to $10_n$, respectively. However, the present invention is not limited to this configuration. The order of the integrators may be limited to a number smaller than n. For example, all of the integrators may be the first-order integrators. The integrators of low order (e.g. second-order or less) are preferably used, since the delta-sigma modulator becomes unstable when the order of the integrators is large. The configuration disclosed in the second preferred embodiment does not intend to limit the order of the integrators.

The two input circuits, which are the input circuits 1 and 2, are provided in the second preferred embodiment. However, the present invention is not limited to this configuration. Three or more input circuits may be provided. In that case, the control signal for controlling the selector 3 and the control signal to be inputted to the delta-sigma modulator do not always correspond one-on-one. The respective bias current sources and the respective selectors in the noise rejecting circuit are controlled, so that the number of stages of quantization loops (or the order of the integrators) is optimum depending on the selected input circuit. Further, the number of the input circuits (m) may be larger than the number of the quantization loops (n). FIG. 5B shows an example of the control of the selectors. The configuration disclosed in the second preferred embodiment does not intend to limit the number of the input circuits.

Third Preferred Embodiment

Figure 6:
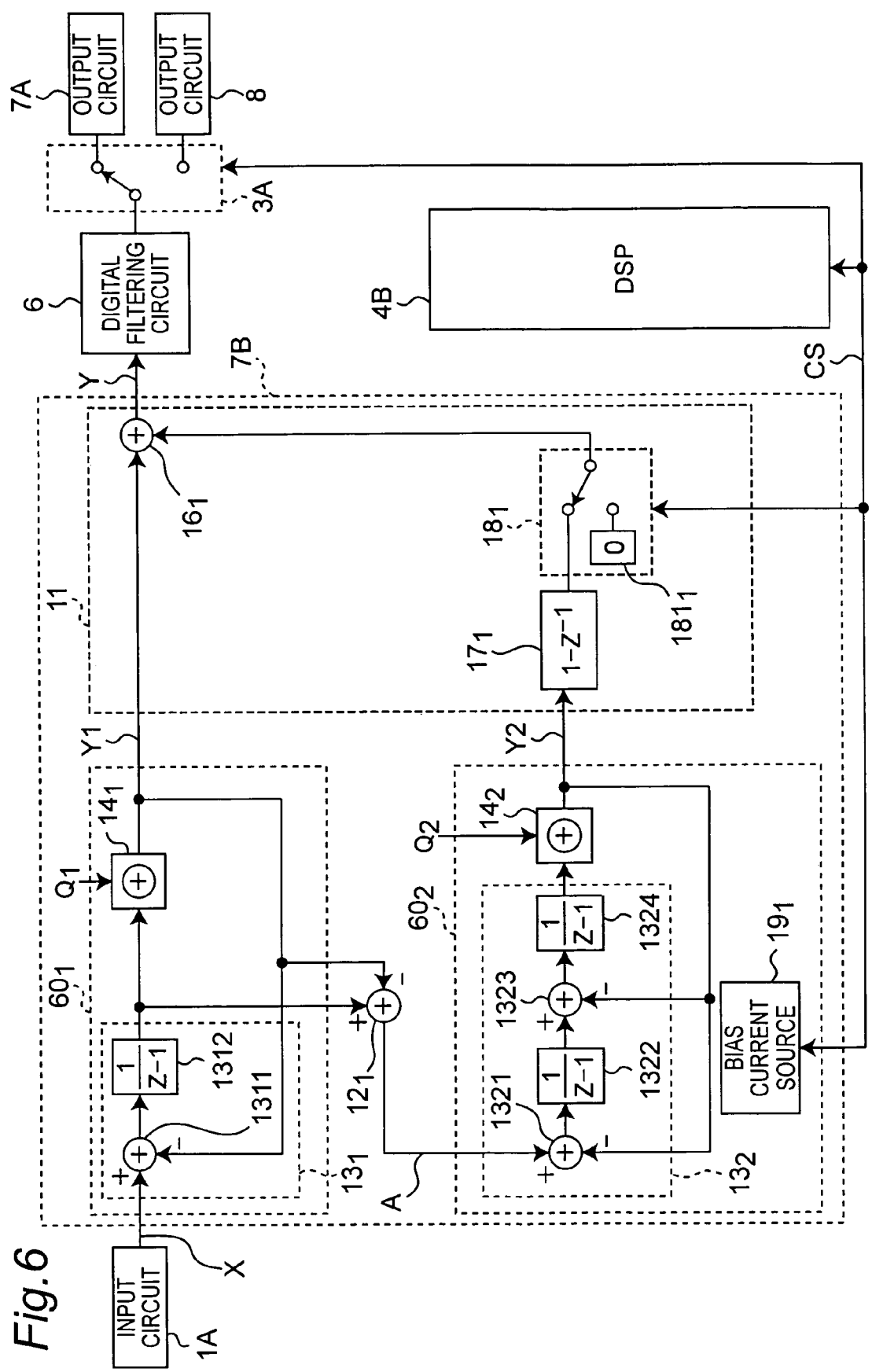
FIG. 6 is a block diagram showing a configuration of a digital-to-analog converter including a cascade-type variable-order delta-sigma modulator in accordance with a third preferred embodiment of the present invention.

Referring to FIG. 6, a cascade-type variable-order delta-sigma modulator in accordance with a third preferred embodiment will be described. FIG. 6 is a block diagram showing a configuration of a digital-to-analog converter including the cascade-type variable-order delta-sigma modulator in accordance with the third preferred embodiment of the present invention. In FIG. 6, the digital-to-analog converter includes a delta-sigma modulator 9B, an analog filtering circuit 6, a DSP 4B, and a selector 3A.

Output circuits 7A and 8 are digital output circuits. For example, the output circuit 7A is an amplifying circuit for a loudspeaker; and the output circuit 8 is a line output circuit. Signal-to-noise ratios (SNRs) of both output circuits differ from each other. An input circuit 1A is, for example, a circuit for outputting digital audio data that is read out from a recording medium.

The DSP 4B is connected to the selector 3A and the delta-sigma modulator 9B. The DSP 4B is a controller that outputs a control signal CS for controlling the selector 3A and the delta-sigma modulator 9B depending on the SNR of a selected output circuit.

The delta-sigma modulator 9B in FIG. 6 is different from the delta-sigma modulator 9 in the analog-to-digital converter of the first preferred embodiment shown in FIG. 1 in that a digital input signal X is inputted from the input circuit 1A as an input signal, a first quantization loop $60_1$ is provided in place of the first quantization loop $10_1$, and a second quantization loop $60_2$ is provided in place of the second quantization loop $10_2$. The first quantization loop $60_1$ and the second quantization loop $60_2$ in FIG. 6 are different from the first quantization loop $10_1$ and the second quantization loop $10_2$ in FIG. 1 in that the digital-to-analog converting units $15_1$ and $15_2$ are removed, respectively. In other respects, the configuration of the delta-sigma modulator 9B is similar to that of the delta-sigma modulator 9 in the analog-to-digital converter of the first preferred embodiment shown in FIG. 1, components similar or equivalent to those of the first preferred embodiment are designated by the same numeral references as that in FIG. 1, and their descriptions are omitted.

The analog filtering circuit 6 is connected to the output terminal of the delta-sigma modulator 9B. The analog filtering circuit 6 rejects a quantization noise of the quantization signal Y, which is shifted out to higher frequency region by the noise shaping of the delta-sigma modulator 9B, and outputs the signal to the selector 3A.

The selector 3A is provided between the analog filtering circuit 6 and the output circuits 7A and 8. The selector 3A selects one of the output circuits 7A and 8 in compliance with the control signal CS from the DSP 4B, and transmits an output signal of the analog filtering circuit 6 to the selected output circuit.

Operation of the digital-to-analog converter including the cascade-type variable-order delta-sigma modulator in accordance with the third preferred embodiment will be described below.

The output circuit 7A has a high SNR, and therefore, the delta-sigma modulator 9B is also required to have a high SNR in the case in which the output circuit 7A is selected as the output circuit to be connected. In this case, the DSP 4B outputs the control signal CS of high level. The bias current source $19_1$, supplies a bias current in the second quantization loop $60_2$. The selector $18_1$ selects the output signal of the differentiator $17_1$, and transmits the selected signal to the adders $16_1$.

Therefore, quantization signal Y2, which is the output signal of the second quantization loop $60_2$, is activated, and so, the delta-sigma modulator 9B has such a configuration that the first quantization loop $60_1$ having the first-order integrator and the second quantization loop $60_2$ having the second-order integrator are connected in a cascade configuration.

According to this configuration, by giving the quantization error of the first quantization loop $60_1$ to the second quantization loop $60_2$, the quantization noise can be shifted out to higher frequency region. As a result, the delta-sigma modulator realizing a high SNR can be obtained. The selector 3A transmits the output signal of the analog filtering circuit 6 to the output circuit 7A.

On the other hand, a SNR of the output circuit 8 is much lower than that of the output circuit 7A, and therefore, the delta-sigma modulator 9B just has to have a low SNR in the case in which the output circuit 8 is selected as the output circuit to be connected. Therefore, the number of stages of the quantization loops of the delta-sigma modulator is decreased, to reduce the power consumption. In this case, the DSP 4B outputs the control signal CS of low level. The bias current source $19_1$ blocks the bias current in the second quantization loop $60_2$. The selector $18_1$ selects the output signal of the zero-signal generator $181_1$, and transmits the selected signal to the adder $16_1$.

Therefore, the quantization signal Y2, which is the output signal of the second quantization loop $60_2$, is de-activated. As a result, the delta-sigma modulator 9B is substantially configured only by the first quantization loop $60_1$ having the first-order integrator.

In this case, the bias current is blocked in the second quantization loop $60_2$, and therefore, it is prevented that wasteful power having been consumed by unused second quantization loop $60_2$ is consumed. As a result, the power consumption of the delta-sigma modulator can be reduced in comparison with the prior art.

As described above, the digital-to-analog converter using the delta-sigma modulator 9B in accordance with the third preferred embodiment has the selector $18_1$, to activate or de-activate the quantization signal Y2, which is the output signal of the second quantization loop $60_2$. Thereby, the number of stages of the quantization loops connected in a cascade configuration is changed depending on the selected output circuit, so that the SNR of the delta-sigma modulator 9B becomes the desired SNR.

When the selector $18_1$ de-activates the output signal of the second quantization loop $60_2$, the bias current to be supplied to the second quantization loop $60_2$ is blocked, so that the second quantization loop $60_2$ becomes the stopping state. Thereby, a power having been consumed by the unused second quantization loop in the prior art can be reduced, and the consumption power of the entire delta-sigma modulator 9B can be reduced. Thus, a cascade-type variable-order delta-sigma modulator with low power consumption can be realized.

The first-order integrator $13_1$ is included in the first quantization loop $60_1$, and the second-order integrator $13_2$ is included in the second quantization loop $60_2$. However, the present invention is not limited to this configuration. The first-order integrators or the second order integrators may be included in the respective quantization loops, or alternatively the second-order integrator may be included in the first quantization loop $60_1$ and the first-order integrator may be included in the second quantization loop $60_2$. The configuration disclosed in the first preferred embodiment does not intend to limit the order of the integrators.

Fourth Preferred Embodiment

Figure 7:
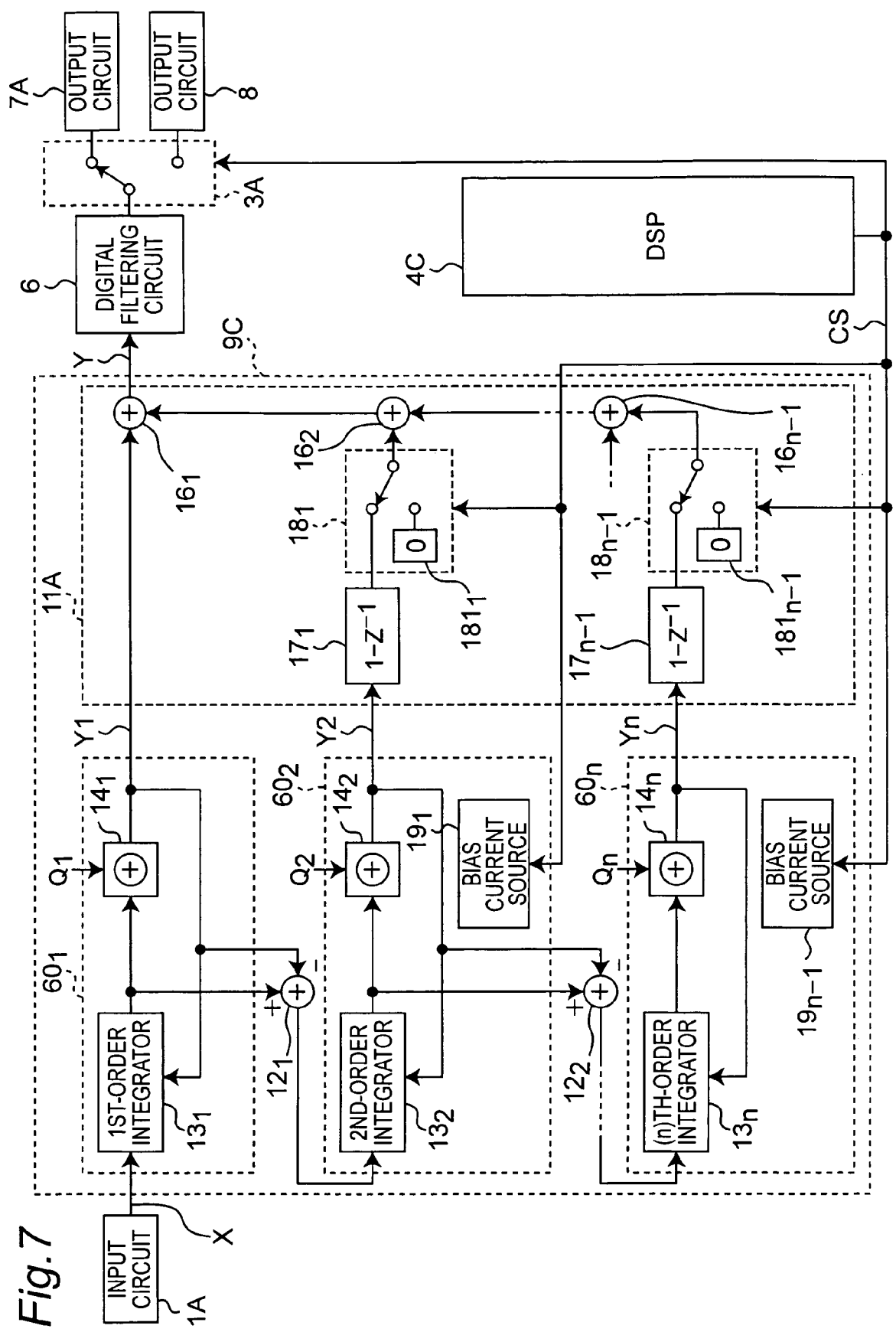
FIG. 7 is a block diagram showing a configuration of a digital-to-analog converter including a cascade-type variable-order delta-sigma modulator in accordance with a fourth preferred embodiment of the present invention.

Referring to FIGS. 7 and 8, a cascade-type variable-order delta-sigma modulator in accordance with a fourth preferred embodiment will be described. FIG. 7 is a block diagram showing a configuration of a digital-to-analog converter including the cascade-type variable-order delta-sigma modulator in accordance with the fourth preferred embodiment of the present invention. In FIG. 7, the digital-to-analog converter according to the fourth preferred embodiment is different from the third preferred embodiment in that a delta-sigma modulator 9C is provided in place of the delta-sigma modulator 9B, and a DSP 4C is provided in place of the DSP 4B. In other respects, the configuration is similar to that of the third preferred embodiment shown in FIG. 6, components similar or equivalent to those of the third preferred embodiment are designated by the same numeral references as those in FIG. 6, and their descriptions are omitted.

The delta-sigma modulator 9C includes first to $n^{th}$ stages of quantization loops $60_1$ to $60_n$ (n is an integer equal to or more than 2), subtracters $12_1$ to $12_{n-1}$ provided between respective quantization loops, and a noise rejecting circuit 11A. The first to $n^{th}$ stages of quantization loops $60_1$ to $60_n$ have first-order to $n^{th}$-order integrators $13_1$ to $13_n$, quantizers $14_1$ to $14_n$, respectively. Further, the second and succeeding stages of the quantization loops $60_2$ to $60_n$ have bias current sources $19_1$ to $19_{n-1}$, respectively.

The quantization loops $60_3$ to $60_n$ of the delta-sigma modulator 9C are similar in configuration and operation to the third quantization loop $60_2$, which is described in detail in the third preferred embodiment, except in that the order of the integrators is different from each other, and therefore, their detailed descriptions are omitted. The subtracters $12_2$ to $12_{n-1}$ are similar in configuration and operation to the subtracter $12_2$ in the third preferred embodiment, and therefore, their detailed descriptions are omitted.

The noise rejecting circuit 11A includes (n−1) differentiators $17_1$ to $17_{n-1}$, (n−1) selectors $18_1$ to $18_{n-1}$, and (n−1) adders $16_1$ to $16_{n-1}$. The differentiators $17_1$ to $17_{n-1}$ differentiate respective output signals Y2 to Yn of the second to succeeding stages of quantization loops $60_2$ to $60_n$. The selectors $18_1$ to $18_{n-1}$ activate or de-activate output signals of the respective differentiators by selecting the respective output signals of the differentiators or respective output signals of zero-signal generators $181_1$ to $181_{n-1}$. The adders $16_1$ to $16_{n-1}$ are provided to sum signal levels of the output signals of respective selectors and signal level of the output signal of the first stage of the quantization loop $60_1$.

The DSP 4C is connected to the selector 3A and the delta-sigma modulator 9C. The DSP 4C is a controller that outputs a control signal CS for controlling the selector 3A and the delta-sigma modulator 9C depending on the SNR of a selected output circuit.

Operation of the digital-to-analog converter including the cascade-type variable-order delta-sigma modulator in accordance with the fourth preferred embodiment will be described below with reference to FIG. 8A.

The output circuit 7A has a high SNR, and therefore, the delta-sigma modulator 9C is also required to have a high SNR in the case in which the output circuit 7A is selected as the output circuit to be connected. In this case, as shown in FIG. 8A, the DSP 4C outputs the control signal CS of high level. The bias current sources $19_1$ to $19_{n-1}$ supply a bias current in the second and succeeding quantization loops $60_2$ to $60_{n-1}$, respectively. The respective selectors $18_1$ to $18_{n-1}$ select the output signals of the differentiators $17_1$ to $17_{n-1}$, and transmit the selected signal to the adders.

Therefore, the quantization signals Y2 to Yn, which are the output signals of the second and succeeding stages of the quantization loops $60_2$ to $60_n$, are activated, and so, the delta-sigma modulator 9C has such a configuration that n-number of quantization loops $60_1$ to $60_n$ respectively having the first-order to $n^{th}$-order integrators are connected in a cascade configuration.

According to this configuration, by giving the quantization error of the previous quantization loop to the next quantization loop, the quantization noise can be shifted out to higher frequency region. As a result, the delta-sigma modulator realizing a high SNR can be obtained. The larger the number of stages (n) is, the higher the SNR is. The selector 3A transmits the output signal of the analog filtering circuit 6 to the output circuit 7A.

On the other hand, a SNR of the output circuit 8 is much lower than that of the output circuit 7A, and therefore, the delta-sigma modulator 9C just has to have a low SNR in the case in which the output circuit 8 is selected as the output circuit to be connected. Therefore, the number of stages of the quantization loops of the delta-sigma modulator is decreased, to reduce the power consumption. In this case, the DSP 4C outputs the control signal CS of low level. The bias current sources $19_1$ to $19_{n-1}$ block the bias current in the second and succeeding stages of quantization loop $60_2$ to $60_n$, respectively. The selectors $18_1$ to $18_{n-1}$ select the output signals of the zero-signal generators $181_1$ to $181_{n-1}$, respectively, and transmit the selected signals to the adders.

Therefore, the quantization signals Y2 to Yn, which are the output signals of the second and succeeding stages of quantization loops $60_2$ to $60_n$, are de-activated. As a result, the delta-sigma modulator 9C is substantially configured only by the first quantization loop $60_1$ having the first-order integrator. The selector 3A transmits the output signal of the analog filtering circuit 6 to the output circuit 8.

In this case, the bias current is blocked in the second and succeeding stages of quantization loops $60_2$ to $60_n$, and therefore, it is prevented that wasteful power having been consumed by unused second and succeeding stages of quantization loops $60_2$ to $60_n$ is consumed. As a result, the power consumption of the delta-sigma modulator can be reduced in comparison with the prior art. The specific means for supplying and blocking the bias current in the second and succeeding stages of quantization loops $60_2$ to $60_n$ has been already described in the first preferred embodiment with reference to FIG. 9.

As described above, the digital-to-analog converter using the delta-sigma modulator 9C in accordance with the fourth preferred embodiment has such a configuration that three or more stages of quantization loops are connected in a cascade configuration. The digital-to-analog converter has the selectors $18_1$ to $18_{n-1}$, to activate or de-activate the quantization signals Y2 to Yn, which are the output signals of the second and succeeding stages of quantization loops $60_2$ to $60_n$. Thereby, the number of stages of the quantization loops connected in a cascade configuration is changed depending on the selected output circuit, so that the SNR of the delta-sigma modulator 9C becomes the desired SNR.

When the selectors $18_1$ to $18_{n-1}$ de-activate the output signals of the second and succeeding stages of quantization loops $60_2$ to $60_n$, the bias current to be supplied to the second and succeeding stages of quantization loops $10_2$ to $10_n$ is blocked, so that the second and succeeding stages of quantization loops $60_2$ to $60_n$ are in the stopping state. Thereby, a power having been consumed by the unused second and succeeding stages of quantization loops in the prior art can be reduced to a large degree, and the consumption power of the entire delta-sigma modulator 9C can be reduced. Thus, a cascade-type variable-order delta-sigma modulator with low power consumption can be realized. The larger the number of stages of quantization loops (n) is, the larger the effect of the reduction of the power consumption is.

The first-order to $n^{th}$-order integrators are included in the first to $n^{th}$ stages of quantization loops $60_1$ to $60_n$, respectively. However, the present invention is not limited to this configuration. The order of the integrators may be limited to a number smaller than n. For example, all of the integrators may be the first-order integrators. The integrators of low order (e.g. second-order or less) are preferably used, since the delta-sigma modulator becomes unstable when the order of the integrators is large. The configuration disclosed in the fourth preferred embodiment does not intend to limit the order of the integrators.

The two output circuits, which are the output circuits 7A and 8, are provided in the fourth preferred embodiment. However, the present invention is not limited to this configuration. Three or more output circuits may be provided. In that case, the control signal for controlling the selector 3A and the control signal to be inputted to the delta-sigma modulator do not always correspond one-on-one. The respective bias current sources and the respective selectors in the noise rejecting circuit are controlled, so that the number of stages of quantization loops (or the order of the integrators) is optimum depending on the selected input circuit. Further, the number of the output circuits (m) may be larger than the number of the quantization loops (n). FIG. 8B shows an example of the control of the selectors. The configuration disclosed in the fourth preferred embodiment does not intend to limit the number of the output circuits.

Further, the selectors $18_1$ to $18_n$ are respectively provided at the output terminals of the differentiators $17_1$ to $17_n$ in the above-mentioned preferred embodiments. However, the present invention is not limited to this configuration. It is understood that the selectors $18_1$ to $18_n$ may be respectively provided at the input terminals of the differentiators $17_1$ to $17_n$, and the same effect as the above-mentioned preferred embodiments can be obtained.

Furthermore, the selector for selecting the input circuit to be connected to the analog-to-digital converter or for the output circuit to be connected to the digital-to-analog converter, and the DSP, which is a controller, are provided outside of the delta-sigma modulator in the above-mentioned preferred embodiments. However, the present invention is not limited to this configuration. The delta-sigma modulator may include one or both of the selector and the DSP, and the same effect as the above-mentioned preferred embodiments can be obtained.

The cascade-type variable-order delta-sigma modulator according to the present invention can be utilized, for example, as an analog-to-digital converter, a digital-to-analog converter, and peripheral circuitries and the like for use in a digital-audio device.

The disclosure of Japanese Patent Application No. 2005-017282 filed Jan. 25, 2005 including specification, drawings and claims is incorporated herein by reference in its entirety.

Although the present invention has been described with respect to its preferred embodiments in some detail, the disclosed contents of the preferred embodiments may change in the details of the structure thereof, and any changes in the combination and sequence of the component may be attained without departing from the scope and spirit of the claimed invention.

What is claimed is:

1. A cascade-type variable-order delta-sigma modulator comprising:
   first to $n^{th}$ stages of delta-sigma modulating type quantization loops, wherein n is an integer greater than or equal to 2, connected in a cascade configuration, each quantization loop quantizing a signal inputted thereto, outputting the quantization result, and feeding the quantization result to itself as a feedback signal, and
   a noise rejecting circuit configured to receive respective output signals from the first to $n^{th}$ stages of quantization loops and a control signal, and to reject a quantization noise of the first stage of quantization loop, the noise rejecting circuit comprising (n−1) first selectors for activating and de-activating the respective output signals of the second and succeeding stages of the quantization loops in compliance with the control signal,
   wherein the noise rejecting circuit comprises:
   (n−1) differentiators provided at respective output terminals of the (n−1) first selectors, respectively differentiating output signals of the (n−1) first selectors; and
   (n−1) adders for summing signal levels of output signals of the (n−1) differentiators and a signal level of an output signal of the first stage of the quantization loop.

2. The cascade-type variable-order delta-sigma modulator of claim 1, wherein the first stage of the quantization loop comprises a first integrator for integrating a difference between an analog input signal inputted from an input circuit and a first feedback signal and outputting the integration result, a first quantizer for quantizing an output signal of the first integrator and outputting the quantization result, and a first converter for generating the first feedback signal from an output signal of the first quantizer and outputting the first feedback signal, and each of the second and succeeding stages of the quantization loops comprises a second integrator for integrating a difference between a quantization error of a previous stage of the quantization loop and a second feedback signal and outputting the integration result, a second quantizer for quantizing an output signal of the second integrator and outputting the quantization result, and a second converter for generating the second feedback signal from an output signal of the second quantizer and outputting the second feedback signal.

3. The cascade-type variable-order delta-sigma modulator of claim 2 further comprising:

a second selector for selecting one signal of signals inputted from a plurality of input circuits in compliance with the control signal and for transmitting the selected signal to the first stage of the quantization loop.

4. The cascade-type variable-order delta-sigma modulator of claim 1, wherein the first stage of the quantization loop comprises a first integrator for integrating a difference between a digital input signal inputted from an input circuit and a first feedback reference level and outputting the integration result, and a first quantizer for quantizing an output signal of the first integrator and outputting the quantization result as the first feedback reference level, and each of the second and succeeding stages of the quantization loops comprises a second integrator for integrating a difference between a quantization error of a previous stage of the quantization loop and a second feedback reference level and outputting the integration result, and a second quantizer for quantizing an output signal of the second integrator and outputting the quantization result as the second feedback reference level.

5. The cascade-type variable-order delta-sigma modulator of claim 4 further comprising:

a second selector for selecting one output circuit of a plurality of output circuits in compliance with the control signal and for transmitting a quantization signal from the noise rejecting circuit to the selected output circuit.

6. The cascade-type variable-order delta-sigma modulator of claim 1, wherein each of the second and succeeding stages of the quantization loops switches over an operating state and a stopping state in compliance with the control signal.

7. The cascade-type variable-order delta-sigma modulator of claim 6, wherein each of the second and succeeding stages of the quantization loops supplies and blocks a bias current or a bias voltage to each of the second and succeeding stages of the quantization loops in compliance with the control signal to switch over an operating state and a stopping state.

8. The cascade-type variable-order delta-sigma modulator of claim 6, wherein each of the second and succeeding stages of the quantization loops comprises:

a switched-capacitor circuit having a plurality of switches and a capacitor, and a logic decision circuit fixing the switches of the switched-capacitor circuit in a certain state when making each of the second and succeeding stages of the quantization loops be in the stopping state in compliance with the control signal.

9. The cascade-type variable-order delta-sigma modulator of claim 6 further comprising:

a controller generating the control signal for controlling the first selector and for switching over an operating state and a stopping state of the second and succeeding stages of the quantization loops.

10. A cascade-type variable-order delta-sigma modulator comprising:

first to $n^{th}$ stages of delta-sigma modulating type quantization loops, wherein n is an integer greater than or equal to 2, connected in a cascade configuration, each quantization loop quantizing a signal inputted thereto, outputting the quantization result, and feeding the quantization result to itself as a feedback signal, and a noise rejecting circuit configured to receive respective output signals from the first to $n^{th}$ stages of quantization loops and a control signal, and to reject a quantization noise of the first stage of quantization loop, the noise rejecting circuit comprising (n−1) first selectors for activating and de-activating the respective output signals of the second and succeeding stages of the quantization loops in compliance with the control signal, wherein the noise rejecting circuit comprises:

(n−1) differentiators provided at respective input terminals of the (n−1) first selectors, respectively differentiating output signals of the second and succeeding quantization loops; and (n−1) adders for summing signal levels of output signals of the (n−1) first selectors and a signal level of an output signal of the first stage of the quantization loop.

11. The cascade-type variable-order delta-sigma modulator of claim 10, wherein the first stage of the quantization loop comprises a first integrator for integrating a difference between an analog input signal inputted from an input circuit and a first feedback signal and outputting the integration result, a first quantizer for quantizing an output signal of the first integrator and outputting the quantization result, and a first converter for generating the first feedback signal from an output signal of the first quantizer and outputting the first feedback signal, and each of the second and succeeding stages of the quantization loops comprises a second integrator for integrating a difference between a quantization error of a previous stage of the quantization loop and a second feedback signal and outputting the integration result, a second quantizer for quantizing an output signal of the second integrator and outputting the quantization result, and a second converter for generating the second feedback signal from an output signal of the second quantizer and outputting the second feedback signal.

12. The cascade-type variable-order delta-sigma modulator of claim 11 further comprising:

a second selector for selecting one signal of signals inputted from a plurality of input circuits in compliance with the control signal and for transmitting the selected signal to the first stage of the quantization loop.

13. The cascade-type variable-order delta-sigma modulator of claim 10, wherein the first stage of the quantization loop comprises a first integrator for integrating a difference between a digital input signal inputted from an input circuit and a first feedback reference level and outputting the integration result, and a first quantizer for quantizing an output signal of the first integrator and outputting the quantization result as the first feedback reference level, and each of the second and succeeding stages of the quantization loops comprises a second integrator for integrating a difference between a quantization error of a previous stage of the quantization loop and a second feedback reference level and outputting the integration result, and a second quantizer for quantizing an output signal of the second integrator and outputting the quantization result as the second feedback reference level.

14. The cascade-type variable-order delta-sigma modulator of claim 13 further comprising:

a second selector for selecting one output circuit of a plurality of output circuits in compliance with the control signal and for transmitting a quantization signal from the noise rejecting circuit to the selected output circuit.

15. The cascade-type variable-order delta-sigma modulator of claim 10, wherein each of the second and succeeding stages of the quantization loops switches over an operating state and a stopping state in compliance with the control signal.

16. The cascade-type variable-order delta-sigma modulator of claim 15, wherein each of the second and succeeding stages of the quantization loops supplies and blocks a bias current or a bias voltage to each of the second and succeeding stages of the quantization loops in compliance with the control signal to switch over an operating state and a stopping state.

17. The cascade-type variable-order delta-sigma modulator of claim 15, wherein each of the second and succeeding stages of the quantization loops comprises:

a switched-capacitor circuit having a plurality of switches and a capacitor, and a logic decision circuit fixing the switches of the switched-capacitor circuit in a certain state when making each of the second and succeeding stages of the quantization loops be in the stopping state in compliance with the control signal.

18. The cascade-type variable-order delta-sigma modulator of claim 15 further comprising:

a controller generating the control signal for controlling the first selector and for switching over an operating state and a stopping state of the second and succeeding stages of the quantization loops.

* * * * *